United States Patent [19]

Feldstein

[11] 4,259,376

[45] Mar. 31, 1981

[54] CATALYTIC PROMOTERS IN ELECTROLESS PLATING CATALYSTS APPLIED AS AN EMULSION

[76] Inventor: Nathan Feldstein, 63 Hemlock Cir., Princeton, N.J. 08540

[21] Appl. No.: 22,518

[22] Filed: Mar. 21, 1979

Related U.S. Application Data

[60] Division of Ser. No. 833,905, Sep. 16, 1977, Pat. No. 4,151,311, which is a continuation-in-part of Ser. No. 651,507, Jan. 22, 1976.

[51] Int. Cl.$^3$ ............................................... C23C 3/02
[52] U.S. Cl. ................................... 427/304; 106/1.11; 427/305; 427/306; 430/417
[58] Field of Search ............... 106/1.11; 427/304–306; 430/417

[56] References Cited

U.S. PATENT DOCUMENTS

| 3,565,622 | 2/1971 | Sincins | 430/354 |
|---|---|---|---|
| 3,716,392 | 2/1973 | Grunwald et al. | 427/306 |
| 3,859,092 | 1/1975 | Gysling et al. | |
| 3,860,500 | 1/1975 | Gysling | |
| 3,860,501 | 1/1975 | Gysling | |
| 3,958,048 | 5/1976 | Donovan et al. | 427/304 |
| 3,959,547 | 5/1976 | Polichette et al. | 427/304 |
| 4,151,311 | 4/1979 | Feldstein | 427/304 |
| 4,160,050 | 7/1979 | Nuzzi et al. | 427/304 |

FOREIGN PATENT DOCUMENTS

| 2335497 | 2/1974 | Fed. Rep. of Germany | 427/304 |
|---|---|---|---|
| 49-43084 | 12/1974 | Japan | 427/304 |

OTHER PUBLICATIONS

Koretzky, "Adhesion of Electroless Metal Films to Nonconductive Substrates," IBM TDB, 13, No. 7, p. 1886, Dec. 1970.
The Condensed Chemical Dictionary, 8th Edition, Van Nostrand Reinhold Co., p. 346, c 1971.

*Primary Examiner*—John D. Smith

[57] ABSTRACT

A composition for catalyzing a substrate prior to electroless metal deposition. The catalyst formulation comprises the admixture of a principal catalytic agent and a catalytic promoting agent. The principal catalytic agent is selected preferably from the metals of Period 4 and Groups IB and VIII of the Periodic Table of the Elements while the catalytic promoting agents are selected from metals of Period 4, 5, 6 and Groups IVB, VB, VIB, and VIIB of the Periodic Table of the Elements.

15 Claims, No Drawings

CATALYTIC PROMOTERS IN ELECTROLESS PLATING CATALYSTS APPLIED AS AN EMULSION

This is a division of application Ser. No. 833,905 filed Sept. 16, 1977, now U.S. Pat. No. 4,151,311, which is a continuation-in-part of U.S. application Ser. No. 651,507 filed Jan. 22, 1976.

Background of the Invention

In the plating of dielectric (non-conductor) substrates by chemical (electroless) plating, it is well known that suitable catalytic pretreatment is a prerequisite for effective electroless metal deposition. Such practices are well known and accepted in the art.

In examining the prior art for catalytic pretreatment it appears that while different procedures have been used, the incorporation of precious metals (e.g. palladium containing solutions) was common to all procedures. One catalytic system of particular interest is the two step process as disclosed in U.S. Pat. No. 3,011,920. The effective catalyst is proposed to be a colloid of an elemental precious metal (e.g. palladium) stabilized by the excess stannous chloride present in the medium. While the system disclosed in U.S. Pat. No. 3,011,920 has been quite popular in commercial practices, rising costs of precious metals, the high acidic content, and miscellaneous product reliability problems have led to the quest for new systems in which the use of precious metals, tin, as well as hydrochloric acid could be completely eliminated.

In meeting this objective it was found, as described in U.S. Pat. No. 3,993,799, that colloidal systems based upon non-precious metals could constitute the basis for catalysts in new commercial plating processes. More specifically it was found that colloid metals, alloys and hydrous-oxides of non-precious metals (preferably of the group consisting of metals of Period 4 and groups IB and VIII of the Period Table of the Elements) may be used in the direct replacement of palladium catalysts used in the art followed by a treatment in a suitable activating medium (which is optional); and thereby providing more energetic catalytic sites capable of initiation of the electroless process. In addition, colloidal matter of compounds bearing the catalytic metals are also of potential use in the present process.

In another system (U.S. Pat. No. 3,993,491) it was found that copper ions in excess of stannous ions may also constitute the basis for the catalysis of non-conductors. Still another system utilizing non-precious metal ions is described in U.S. Pat. Nos. 3,772,056 and 3,772,078 issued to Polichette et al. In the systems described therein, the dielectric substrate to be plated is immersed in a solution of non-precious metal ions, and then dried to promote adherence of the ions to the dielectric surface. The retained ions may then be reduced to the metallic state by heat, light or chemical means. A system of this nature is a significant departure from the standard commercial process as a result of the required intermediate drying step to achieve the required adhesion. In standard commercial processes, the article to be plated is passed from one aqueous treating tank to another with intermediate rinsing steps to remove excessive material and hence minimize cross-contamination. A procedure of this nature is essential due to the automation of most plating operations and thus the Polichette et al. procedure would require a major modification in standard equipment and procedures, thus rendering the process unattractive and costly. A process for electroless plating, to be commercially feasible, should be adaptable to existing commercial processing techniques.

The present invention and procedures are intended to improve the performance of such non-noble (preferably consisting of the metals of Period 4 and Groups IB and VIII of the Periodic Table of the Elements) based catalytic systems. However, it is not to be limited to any specific manner or mechanism by which these metals are applied (true solutions vs. colloidal dispersions or emulsions) to or found on the surface (i.e., oxidation state) of the substrate to be plated.

This invention is further an improvement of the copending application Ser. No. 605,571 which is included herein by reference.

SUMMARY OF THE INVENTION

A process of preparing a catalytic composition for electroless plating or image intensification processes, comprises the steps of (a) forming a principal catalyst consisting of a colloidal dispersion and then (b) admixing said primary catalyst with a promoter. When necessary, the above is then treated with an activating composition.

DETAILED DESCRIPTION OF THE INVENTION

The catalytic compositions of the present invention are applicable to the metallic plating of a wide variety of dielectric substrates, including thermoplastic and thermosetting resins, and especially in the fabrication of printed circuitry arrays. Printed circuits may be fabricated by any of several techniques such as copper clad with thru-holes, and semi and total additive methods. Accordingly using the present invention in such fabrication methods obviously falls within the spirit of this invention. Normally, these substrates are etched, e.g., by treatment with a solution of chromium oxide and sulfuric acid or by 'dry' processes (corrona discharge) as known in the art, prior to plating in order to improve wettability and the subsequent adhesion of the metallic coating. Following the pre-treatment the substrate is contacted with a catalytic composition in accordance with the present invention.

The term "Catalytic compositions" as used herein is intended to encompass compositions comprising inorganic compounds and mixtures thereof which are either soluble, sparingly or completely insoluble in the solvent or dispersing media and which include both the principal catalytic agent and compounds comprising the catalytic promoting agent. Such compositions when contacted with the substrate to be plated, catalyze the substrate directly or indirectly for electroless plating. The solvent or dispersing medium (hereinafter used interchangeably) is preferably water.

"Principal Catalytic Agent" as used herein is intended to include the derivative of the cationic portion of non-noble metals (e.g., nickel, cobalt, copper and iron) of the inorganic compounds comprising the catalytic compositions. This agent may be in any of several oxidation states or phases. This catalytic agent further provides, directly or indirectly, portions of the catalytic sites for the initiation of the electroless plating process. It is recognized that the mechanism of initiation of electroless plating may vary with the nature of the catalytic agent and with the electroless plating bath(s) used. For example, the initiation mechanism is different for electroless copper (formaldehyde based) plating in the presence of iron, as compared with cuprous or copper on the substrate surface prior to the electroless initiation. This invention is thus not limited with respect to the initiation mechanism between the catalytic surface and the electroless plating formulations and as such various non-precious (non-noble) metal derivatives may be used, of which copper, cobalt, nickel and iron are preferred. In addition, this invention is not limited to the number of phases existing in said catalytic compositions. The use of other catalytic metals should be evident in view of the references cited herein.

The term "Catalytic Promoter Agent" as used in the present invention refers to chemical substances (e.g., compounds) which while alone are generally inert (relative to the principle catalytic agent) in said electroless plating process, when they are combined with the principal catalytic agent as described by the novel catalytic composition herein, promote unexpected increased catalytic activity when the catalyzed substrate is contacted with the electroless plating bath. This increased catalytic activity generally may be observed as a reduction of the induction time for the electroless process and/or as improved metallic coverage or other parameters well recognized by one skilled in the art. Preferred promoters are selected from compounds of metals in Periods 4, 5 and 6 and Groups IVB, VB, VIB and VIIB of the Periodic Table of the Elements.

In addition to the promoters which fall into the aforementioned groups, certain other elements have also been found to have a promoter effect. However, to date, the observed effect of these other promoters is considerably less than the primary promoters of Groups IVB, VB, VIB and VIIB. Examples of these other promoters are: magnesium, calcium and yittrium. Such other promoters could be useful in processes of electroless metal deposition on pre-catalyzed substrates. Furthermore, in the group of zinc, cadmium and mercury an increased trend towards catalytic inhibition was noted in going from zinc to mercury.

The term "activation" refers to the step in the process through which the induction time for electroless plating on the catalytic sites previously formed on the surface of the substrate is reduced; this step may be optional. The term "activator" therefore, encompasses any composition, substance or form of energy (e.g., UV Light) or heat or combination thereof which results in activation of the catalytic sites. This step can be implemented as taught by the references cited herein. Applying the activation and/or catalyzation steps. Examples of such selective techniques can be found in a published survey by Feldstein, Plating, August 1970, but are not limited to those examples.

One form of activator is a composition which reduces the valence of the cationic portion leading to the principal catalytic agent. Typical reducing agents useful in the practice of the invention are derivatives of soluble borohydrides ($NaBH_4$). Under certain conditions, portions of the surface product after chemical reduction with above reducing agents exhibit the characteristics of metallic borides (e.g., $Cu_2P$, and $Ni_2B$). As such, these are also part of the catalytic sites available for electroless initiation.

It should be noted that a separate activation step is not always necessary if suitable chemical components which cause activation are included in the chemical plating bath.

Another form of activation may be immersion into a chemical composition which selectively removes specific components (e.g. colloid stabilizer) present on the substrate after contacting with the catalytic compositions and thereby exposing active sites for the plating initiation.

The term "colloid stabilizer" is used herein to generally describe substrates believed to be absorbed onto the colloids thereby altering the surface charge characteristics of said colloids preventing their coagulation. Stabilizers contemplated by the present invention include secondary colloids (e.g. gelatin, agar-agar, proteins, starch, albumin etc.), polyalcohols (e.g. glycerol), surfactants selected from the general classes of anionic, cationic, amphoterics and nonioninics such as: stearyl-dimethylbenzyl ammonium chloride, t-$C_{12}$-$C_{14}NH(CH_2CH_2O)_{15}$ H, sodium alkylaryl polyether sulfonate, dioctyl sodium sulfosuccinate, sodium lauryl-sulfate and ammonium lignin sulfonate (either in the presence or absence of sugars), sodium tetradecyl sulfate, sodium heptadecyl sulfate, alkylaryl polyether, amine polyglycol condensate, etc., dispersants and sugars (maltose, raffinose, etc.) which while themselves do not serve to catalyze the dielectric substrate in this process, are believed to stabilize the catalytic colloid(s).

In general, the electroless coating process of the present invention comprises contacting, e.g. by immersion, the dielectric substrate, (preferably previously etched) with the catalytic composition, rinsing the substrate with deionized water and then contacting the substrate with activator to form a discontinuous coating of the catalytic sites on the surface of the substrate for the initiation of the electroless process upon subsequent immersion of the substrate in an appropriate electroless plating bath.

More specifically, the improved composition and process of the present invention is comprised of the following sequence of steps followed by electroless plating.

(1) Immersing a dielectric substrate (preferably previously etched) in a catalytic composition comprising the admixture of the principal catalytic agent of a non-precious metal, preferably selected from at least one member of the group consisting of copper, nickel, cobalt, iron and mixtures thereof; and the catalytic promoting agent preferably selected from the group consisting of manganese, chromium, tungsten, molybdenum zirconium and vanadium and mixtures thereof.

(2) Rinsing the substrate with water to remove excess catalytic composition.

(3) (Optional) immersing (or exposing) the substrate after rinsing to an activator.

(4) Optionally rinsing the substrate with water prior to electroless plating, and (5) Electroless metal deposition.

For the sake of convenience, certain of the examples set forth hereinafter will not refer to the intermediate rinsing steps. A rinsing step (step 2) is, in all instances, involved however. In specific instances, it is possible to delete steps 3 and 4 as set forth above by directly immersing the substrate, after rinsing, in an electroless plating solution containing a suitable activator (e.g. reducing agent).

The following examples are illustrative of the present invention and are not to be taken in limitation thereof:

In demonstrating and evaluating the findings of the present invention, the following general procedure was adopted unless otherwise stated:

(1) ABS substrates (Monsanto PG Grey 299) were etched for about 10 minutes in a solution comprising of 400 g/l $CrO_3$, 350 ml/l $H_2SO_4$ and 0.5 g/l FC-95 at 70° C. and rinsed.

(2) Sections of the etched ABS substrates were immersed in the catalytic solutions at 50° C. for 5 minutes and rinsed.

(3) Substrates from step 2 were activated; e.g. immersion into a solution comprising of 0.5 g/l $NaBH_4$ at 24 to 27° C. for 3 minutes and rinsed.

(4) Catalyzed substrates were immersed into either electroless copper or electroless nickel (both at 50° C.±3° C.) formulation and both the induction time and percent coverage of the surface was recorded. In the case of the electroless copper the percent coverage (estimated visually) was recorded after 1 minute of immersion while in the case of the nickel the percent coverage was noted after 2 minutes of immersion.

The following electroless baths were used in the evaluation:

| Bath A | |
|---|---|
| $CuSO_4 . 5H_2O$ | 15 g/l |
| EDTA (40%) | 68 cc/l |
| NaOH | 9 g/l |
| NaCN | 3 ppm |
| $H_2CO$ (37%) | 22 cc/l |
| Tergitol TMN | 0.2 (% wt) |
| (A nonionic sufactant product of Union Carbide) | |

| Bath B | |
|---|---|
| $NiSO_4$ | $2.7 \times 10^{-2} M$ |
| $Na_4P_2O_7$ | $7.8 \times 10^{-2} M$ |
| $NaH_2PO_2$ | $1.1 \times 10^{-1} M$ |

It is further noted that in each case simultaneous comparison to the control solution was made as to obtain an accurate comparison and thereby discounting any variations in the process (e.g. temperature). Typical results were as follows with the second set of numbers (when it appears) representing the values corresponding to control solution.

EXAMPLE 1

Control catalytic solution used:

| | |
|---|---|
| $NiSO_4.6H_2O$ | 3.6 g/l |
| Ammonium lignin sulfonate | 3.1 g/l |
| NaOH | 1.0 g/l |

Test 1: same as control with 0.35 g/l $NaVO_3.H_2O$ present

Using the above procedure and plating bath A the test solution and control both gave 5 sec. induction time and 100% coverage.

EXAMPLE 2

Control catalytic solution used:

| | |
|---|---|
| $CoSO_4 . 7H_2O$ | 3.6 g/l |
| Ammonium lignin sulfonate | 3.1 g/l |
| NaOH | 1.0 g/l |

Test 1: Same as control with 0.3 g/l of $Na_2MoO_4 . 2H_2O$ present.
Test 2: Same as control with 0.20 g/l of $MnCl_2 . 4H_2O$ present.*
Test 3: Same as control with 0.5 g/l of $Cr(NO_3)_3 . 9H_2O$ present.
Test 4: Same as control with 1.2 g/l of $Na_2WO_4 . 2H_2O$ present.
Test 5: Same as control with 0.17 g/l of $NaVO_3 . H_2O$ present.
Test 6: Same as control with 1.2 g/l of $ZrOCl_2 . 8H_2O$ present.

*Substituting $KMnO_4$ for $MnCl_2$ also showed some promoting effect.

| | Induction time (sec) and metallic coverage (%) | | |
|---|---|---|---|
| | With promoter | vs | W/o promoter |
| Plating Bath A | | | |
| Test 1 | 7 & 100 | vs | 10 & 100 |
| Test 2 | 10 & 100 | vs | 10 & 70 |
| Test 3 | 10 & 100 | vs | 15 & 100 |
| Test 4 | 5 & 100 | vs | 17 & 95 |
| Test 5 | 12 & 100 | vs | 17 & 95 |
| Test 6 | 5 & 100 | vs | 15 & 100 |
| Plating Bath B | | | |
| Test 1 | 30 & 100 | vs | 30 & 40 (average of two sides) |
| Test 2 | 20 & 100 | vs | 35 & 10 |
| Test 3 | 30 & 100 | vs | 35 & 30 |
| Test 6 | (?)&(100 & 10) (per side) | vs | 35 & 15 |

EXAMPLE 3

Control catalytic solution used:

| | |
|---|---|
| $Cu(NO_3)_2 . 3H_2O$ | 3.6 g/l |
| Ammonium lignin sulfonate | 3.1 g/l |
| NaOH | 1.0 g/l |

Test 1: same as control with 0.12 g/l of $NaVO_3 . H_2O$ present
Test 2: same as control with 0.35 g/l of $NaVO_3 . H_2O$ present Evaluation results in bath A were as follows:

| | Induction time (sec.) & metallic coverage (%) | | |
|---|---|---|---|
| | W/o promoter | vs | With promoter |
| Test 1 | 18 & 100 | vs | 15 & 100 |
| Test 2 | 25 & 50 | vs | 25 & 100 |

It is further noted that while these results were obtained in the above electroless copper bath, using commercially available copper baths the present findings show a more pronounced effect. This is believed to be due to the fact that the commercial copper bath are stabilized to a greater extent than the bath disclosed as bath A.

EXAMPLE 4

Using a catalytic composition comprised of stannous and coprous ions, addition of manganese chloride as the promoter did provide improved catalytic performance.

It was found that the incorporation of the catalytic promoter agent(s) can be admixed prior to the colloid nucleation or post colloid nucleation. For example, using a catalytic composition comprised of the admixture of;

| | |
|---|---|
| $CoCl_2 . 6H_2O$ | 2.38 g/l |
| $CuSO_4 . 5H_2O$ | 9.96 g/l |
| Sodium Lignosulfonate* | 12.0 g/l |
| $MnCl_24H_2O$ | 0.19 g/l |
| $NaBH_4$ | 0.76 g/l |
| NaOH | 8.0 g/l |

*some reducing sugars are present.

It was found that better plating results are encountered when the catalytic promoter agent is added post the colloid nucleation step.

In general, it has been noted that promoters showed a more significant effect(s) with electroless plating formulations having a greater apparent activation energy. Such is the case in the comparison of bath A vs. bath B where bath B has a higher apparent activation energy than bath A. Moreover, incorporation of materials (e.g. Zn, Cd and others) while they did not adversely affect the results noted in bath A, they showed a clear tendency of inhibition when bath B was employed.

It is further noted that in using the present invention it is essential that the chemical components present in the electroless bath be favorably compatible with the catalytic surface and its composition. Specifically, one must be assured that the baths component(s) do not deactivate the catalytic surface when brought in contact. From the examples submitted, however, it is noted that the materials which are useful as catalytic promoters fall within Periods 4, 5 and 6 and Groups IVB, VB, VIB, and VIIB of the Periodic Table of the Elements, all the elements having incomplete d-orbitals. While in my investigation, most commonly available materials have been tested (e.g. compounds of V, Cr, Mn, Mo, Zr and W) extension of this work to other materials within the periods and groups described is an obvious extension and hence falls into the spirit of this invention.

While it is not known exactly the manner by which the catalytic promoter agent is retained (adsorption and/or absorption) onto the substrate or the principal catalytic agent, it has been recognized that its addition to the catalytic solution must be controlled since too little of a concentration may not exhibit the catalytic promoting effect while too high may inhibit the entire process. Accordingly, for incorporation of such agents it is therefore best to determine the effective (optimum) concentration by a trial procedure with full consideration of the entire process, compositions, substrate, catalytic media and plating solution(s).

In the electroless plating of catalytically pretreated non-conductors it is highly desirable to achieve conditions whereby the induction time for the electroless process is short (e.g. less than 30 seconds) and with complete coverage in less than 1-minute time. Prolonged induction times generally result in poor metallic coverage (i.e., skip-plating), hence resulting in poor process reliability. It is thus highly desirable to achieve conditions whereby the induction time is shortened but without changing, for instance, the electroless plating activity (temperature). This invention describes a way for achieving such a goal.

While I do not wish to be bound by theory, based upon my findings it is expected that after the catalyzation and activation steps the surface of the substrate to be plated would comprise both the metal(s) constituting the principle catalytic agent(s) as well as the metal(s) or compound constituting the catalytic promoting agent(s). Their exact oxidation states or possible alloying compositions is not known and would be most difficult to ascertain since the phenomenon at hand forms a "discontinuous film" which is highly amorphous and not readily comparable with diffraction patterns available for bulk materials.

I have also recognized that my findings disclosed herein could play a significant role in selective metal deposition or in photographic systems based upon non-precious metals. For example, U.S. Pat. Nos. 3,859,092, 3,860,500 and 3,860,501 demonstrate processes for photographic (Image reproduction) or printed circuitry applications whereby photosensitive copper (I) complexes are irradiated and then developed in electroless plating formulations. Therefore, it should be obvious that the incorporation of the present findings to technologies related to imaging using metals selected from the group consisting of iron, copper, cobalt and nickel falls within the spirit of this invention, and the teachings in those patents is incorporated herein by reference.

What I claim is:

1. A process for the electroless plating of a non-conductor surface comprising (1) contacting said surface with an emulsion comprising the admixture of a principal catalytic agent wherein said principal catalytic agent is a compound of a metal selected from the group of metals consisting of copper, nickel, cobalt and iron and mixtures thereof and a catalytic promoter agent wherein said catalytic agent is a compound of a metal selected from the group of metals consisting of Mg, Ca, Sr, Sc, Y, La, Ti, Zr, Hf, Nb, Ta, Cr, Mo, Wv, Mn, Tc and Re and mixtures thereof and further wherein the concentrations for the principal catalytic agent and the catalytic promoter agent are so adjusted as to yield enhanced catalytic activity for electroless plating initiation in comparison to the same emulsion in the absence of said catalytic promoter agent, and (2) contacting the treated non-conductor surface with an electroless (chemical) plating bath.

2. The process according to claim 1 wherein said catalytic promoter agent is at least one compound of a metal selected from the group consisting of metals of Periods 4, 5, 6 and Groups IVB, VB, VIB and VIIB of the Periodic Table of the Elements.

3. The process according to claim 1 wherein said principal catalytic promoter agent is selected from at least one member of the group consisting of chromium, vanadium, moybdenum, tungsten 4. The process according to claim 1 wherein said electroless metal deposition is electroless copper.

5. The process according to claim 1 wherein said electroless metal deposition yields an image intensification.

6. The process according to claim 1 further containing the step of metal deposition.

7. The process according to claim 1 wherein said non-conductor surface is selectively catalyzed.

8. The process according to claim 1 further containing the step of activation whereby the induction time for the actual deposition is reduced.

9. The process according to claim 1 wherein said non-conductor is ABS.

10. The process according to claim 1 wherein said principal catalytic agent is a compound of copper and further contains a nickel compound.

11. The process according to claim 1 wherein said principle catalytic agent is a compound of copper and further contains a cobalt compound.

12. The process according to claim 1 wherein the concentration of the principle catalytic agent is greater than the concentration of the catalytic promoter agent.

13. The process according to claim 1 further containing the step of activation and wherein said activation comprises a reduction step and wherein said reduction may be effected via a chemical reducing agent or light or heat and combinations thereof.

14. The process according to claim 1 wherein the concentration of said catalytic promoter agent is from about 0.12 g/l to about 1.2 g/l.

15. The process according to claim 1 wherein said principal catalytic agent is a compound bearing Cu(I).

* * * * *